United States Patent
Fischer

(10) Patent No.: US 6,272,103 B1
(45) Date of Patent: Aug. 7, 2001

(54) SIGNAL ATTENUATION USING A FILTER-LIMITER CONNECTION WITH A THRESHOLD SETTING NETWORK

(75) Inventor: Michael C. Fischer, Palo Alto, CA (US)

(73) Assignee: Hewlett-Packard Co, Palo Alto, CA (US)

( * ) Notice: Subject to any disclaimer, the term of this patent is extended or adjusted under 35 U.S.C. 154(b) by 0 days.

(21) Appl. No.: 09/181,691

(22) Filed: Oct. 28, 1998

(51) Int. Cl.[7] ........................................ G11B 7/09
(52) U.S. Cl. .................. 369/124.11; 369/124.01
(58) Field of Search .................. 369/124.11, 124.13, 369/124.14, 124.15, 47.15, 47.19, 44.26, 124.01

(56) References Cited

U.S. PATENT DOCUMENTS

| | | | |
|---|---|---|---|
| 4,516,235 | * | 5/1985 | Tarzaiski ........................ 369/116 OR |
| 5,463,603 | * | 10/1995 | Petersen .................... 369/124.11 OR |
| 5,696,752 | * | 12/1997 | Hajjai ....................... 369/124.11 OR |
| 5,757,248 | * | 5/1998 | Kiyoura et al. ............. 369/124.11 X |
| 5,936,933 | * | 8/1999 | Miyamoto et al. ........... 369/44.13 X |

FOREIGN PATENT DOCUMENTS

| | | |
|---|---|---|
| 0068548 | 1/1983 | (EP) . |
| 0821350 | 1/1998 | (JP) . |

OTHER PUBLICATIONS

Introductory Signals and Circuits, Cruz et al, Univ. of Ill., Blaisdell Publishing Co., 1967, pp. 267–302.*

* cited by examiner

Primary Examiner—Aristotelis M. Psitos

(57) ABSTRACT

Method and apparatus for recovering a timing reference signal in an optical storage subsystem. The timing reference signal is recovered by passing it through a zonal bandpass filter coupled to a hard limiter, which feeds a phase locked loop that produces the reference signal.

12 Claims, 3 Drawing Sheets

SIGNAL ATTENUATION USING A FILTER-LIMITER CONNECTION WITH A THRESHOLD SETTING NETWORK

BACKGROUND OF THE INVENTION

Field of the Invention

The present invention pertains to clock recovery in optical storage systems. In such systems, a laser is typically used to read and write data stored in a rotating medium. During these processes, light reflecting from the medium is used for other processes, such as tracking the optical head with respect to the medium, adjusting the rotational velocity of the medium, and recovering clock information.

Recovered clock information is used typically in a phase locked loop (PLL) which locks to a clock reference and generates a write data clock. One issue that arises with such a PLL is the inability to distinguish at high speed the differences between amplitude and phase differences. One approach to handling amplitude differences uses techniques such as automatic gain control (AGC) circuitry to normalize signal amplitude into the PLL. However, for applications such as DVD-RW and DVD-RAM, these AGC structures are too slow. This is especially true given the extreme changes in laser power and therefore in reflected light during the rapid and dramatic changes in laser power from the level needed to read marks up to the levels needed to write marks and back down again.

Another approach is a normalizer circuit which divides the various outputs of the optical detector by the sum of all the detector outputs. However, currently available normalizer designs are too slow to track the rapid changes between the read, write, and erase levels; the use of a normalized signal input to the PLL would introduce signal shifts resulting in phase errors.

To compensate for large signal level changes then, traditional AGC circuitry and normalizer designs are too slow or imprecise. What is needed is a way to stabilize the signal level to the PLL, adjusting for amplitude changes due to the rapid changes in laser power levels from read to write to erase.

SUMMARY OF THE INVENTION

A hard limiter in combination with a zonal bandpass filter is used to compensate for amplitude variations in the reference signal provided to the PLL in an optical data storage subsystem used to produce a timing reference signal. The zonal bandpass filter is placed at the input to the limiter to reduce or eliminate out of band noise that a hard limiter would alias into the passband of interest. The hard limiter then outputs a digital signal whose zero crossings accurately represent the zero crossings of the input reference signal. This signal is used as the reference to the PLL.

BRIEF DESCRIPTION OF THE DRAWINGS

The present invention is described with respect to particular exemplary embodiments thereof and reference is made to the drawings in which.

DETAILED DESCRIPTION

Figures 1, 2:
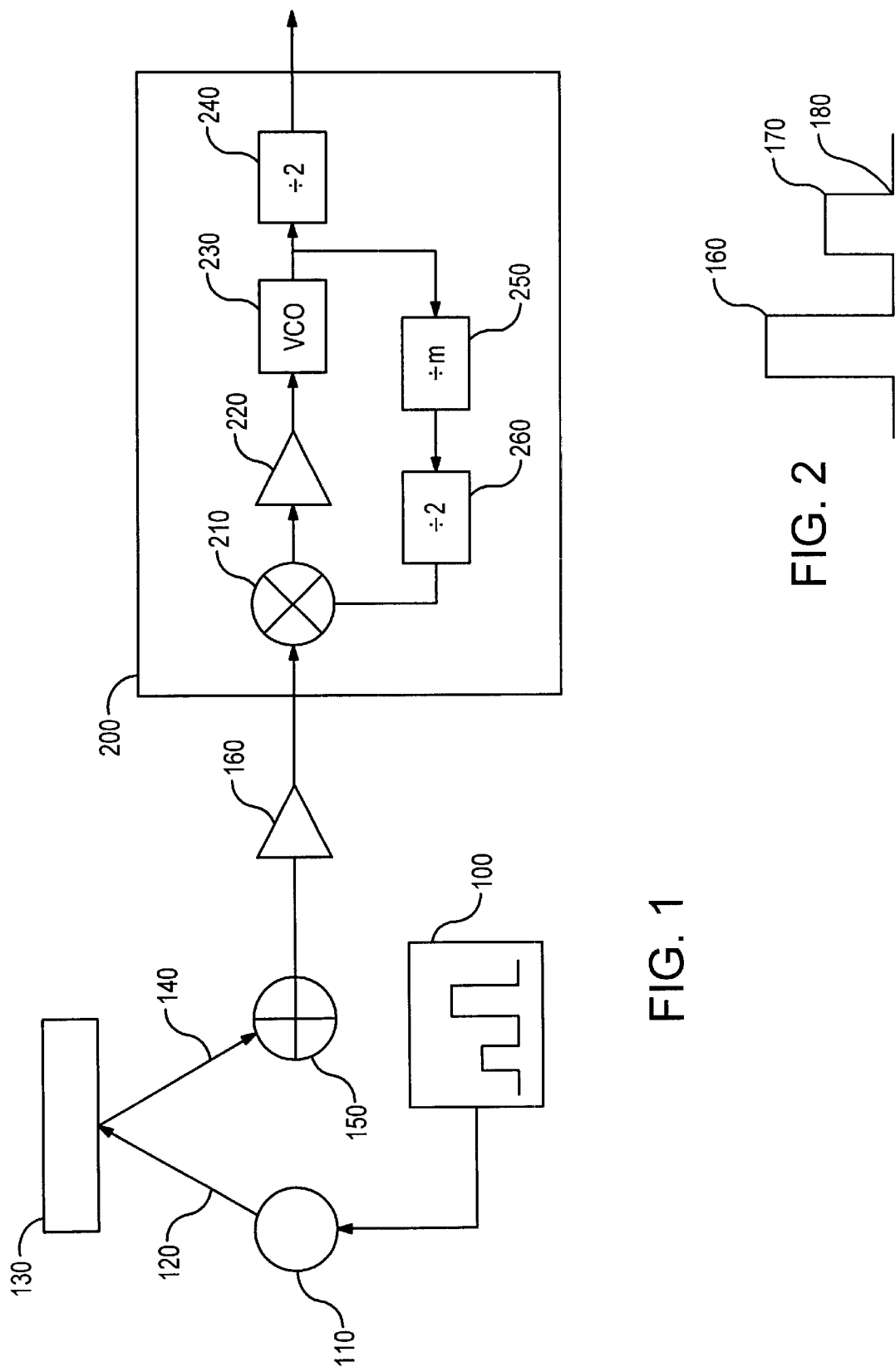
FIG. 1 shows a PLL in an optical system.
FIG. 2 shows a diagram of a write pulse.

FIG. 1 shows a digital PLL in an optical data storage system. Write controller 100 sends signals controlling the power level of laser 110. Laser Radiation 120 is directed to storage media 130, reflecting 140 to optical pickup 150. The signal from optical pickup 150 is supplied through optional amplifier 160 to Phase Locked Loop subsystem 200. The operation of Phase Locked Loops is understood in the art and is described for example in *The Art of Electronics* by Horowitz and Hill, 2nd Edition, Cambridge University Press, 1989, section 9.27, pp. 641–655. Digital phase detector 210 compares the input signal with the signal from VCO 230, producing a phase error signal. This phase error signal is conditioned by loop filter 220 and used to control the input of voltage controlled oscillator (VCO) 230. In phase locked loops using digital phase detectors it is common to run the VCO at a multiple of the input frequency. Digital phase detectors require input signals having close to a 50% duty cycle. By insuring that the frequency division process has as its final stage a divide by two, as shown with dividers 250 and 260, a 50% duty cycle input to digital phase detector 210 is provided.

FIG. 2 shows the diagram of a write pulse, representing the different power levels generated by laser 110 of FIG. 1. The lowest power level is read level 190 used in reading information from the storage medium, followed by erase level 180, used to erase previously stored information, and the highest power, write level 170, used for writing information. There is also a fourth state for the laser, off, not significant in the current invention. In operation, these different power levels of laser 110 result in rapid and dramatic changes in the level of reflected radiation 140 impinging upon optical pickup 150. The voltage levels vary with detector configuration, but typical laser power levels for write, erase, and read are 10 milliwatts (mW), 5 mW, and 1 mW respectively. For a detector with linear response to incident light power the output voltage would swing over a 10 to 1 range. PLL 200 for best performance requires a fairly stable level of reference signal input to phase detector 210. Automatic Gain Control (AGC) amplifiers and normalizers are too slow to deal with the rapid changes in power levels.

Figure 3:
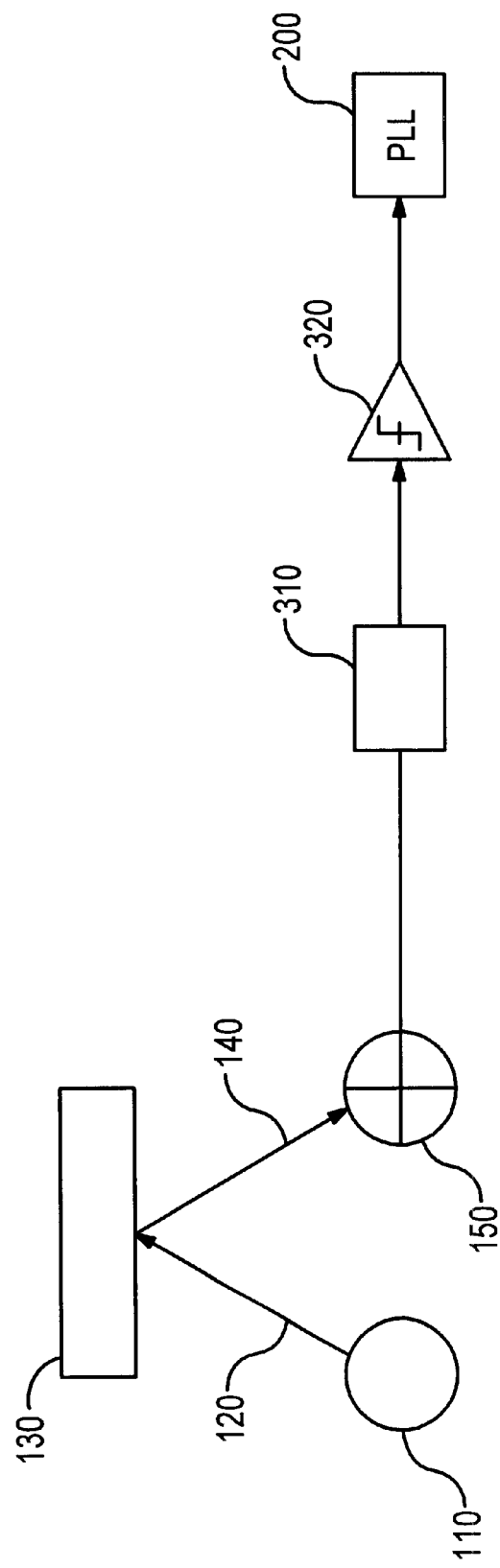
FIG. 3 shows a PLL using according to the present invention.

FIG. 3 shows in block diagram form the present invention. Optical pickup 150 supplies signal to zonal band pass filter 310, which attenuates signals outside the frequency of interest. This prevents these frequencies from being aliased by the phase detector of PLL 200, resulting in phase errors. Limiter 320 removes amplitude variations from the filtered signal, essentially retaining only zero crossings, sending this signal to PLL 200.

Figure 4:
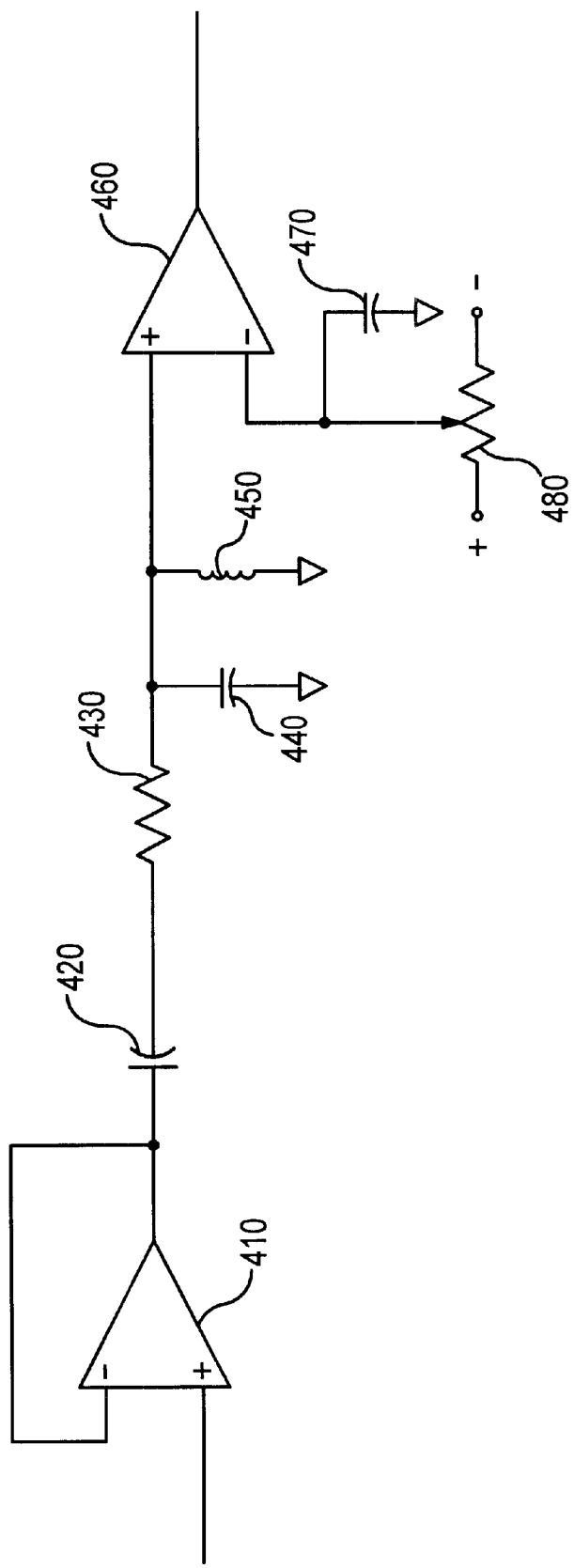
FIG. 4 shows a diagram of the zonal band pass filter and limiter according to the present invention.

FIG. 4 shows a diagram of zonal bandpass filter 310 and limiter 320 in greater detail. Buffer amplifier 410 may be required if the signal source is not capable of driving the zonal bandpass filter. Any high performance operational amplifier or buffer may be used, such as the CLC440 from National Semiconductor. For clarity, circuit details known to the art such as power supply connections, bypassing, offset trim and the like are not shown in FIG. 4. While amplifier 410 is shown connected as a unity gain buffer, it may also be used to provide gain.

The zonal bandpass filter consists of the parallel resonant circuit made from inductor 450, capacitor 440, and Q setting resistor 430. Capacitor 420 blocks any DC levels present at the output of buffer 410. The zonal bandpass filter passes energy at the frequencies of interest by providing a high impedance at the resonant frequency of the LC combination 450 and 440. The impedance of this LC network decreases away from the resonant frequency, attenuating signals out of the desired band. Resistor 430 sets the Q, or shape factor for the filter. In the preferred embodiment, the Q is approximately 3.

For a reference frequency of approximately 3 MHz, capacitor 420 is 100 nanofarads. Resistor 430 is 100 ohms. Capacitor 440 is 3.9 nanofarads and inductor 450 is 680 nanohenries. These component values may be scaled as is known in the art.

For a tracking filter needed for a CAV system the reference frequency shifts over a 2.5 to 1 range, and the resonant frequency of the zonal bandpass filter must change accordingly. This can be performed for example through the use of varactor diodes replacing or supplementing capacitor 440. The bias on the diodes and therefore their capacitance are varied so that the resonant frequency tracks the data.

In the embodiment shown, a first order filter is used. Higher order filters may also be used, taking into consideration the variation in signal frequency that may occur as a result of the normal motor speed control process. The filter Q must be high enough to ring through missing pulses, but low enough so as to pass the range of frequencies expected due to motor speed variations.

The output of the zonal bandpass filter is sent to one input of comparator 460. The other input of comparator 460 is provided by the simplified threshold setting network made of bypass capacitor 470, 100 nanofarads in the preferred embodiment, and variable resistor 480, 5K ohms. Comparator 460 may be any high performance comparator such as the AD96685 from Analog Devices. The AD96685 has a differential ECL output; additional circuitry may be needed to convert this differential output to a single ended output suitable for the phase detector of the PLL.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A signal attenuating device for an optical medium data storage apparatus having an optical pickup and a phase locked loop, said signal attenuating device comprising:
    a bandpass filter configured to pass specific frequencies of interest and to attenuate signals outside of said specific frequencies; and
    an amplitude limiter coupled to an output of said bandpass filter, said amplitude limiter being configured to shape signals at said output of said bandpass filter, said amplitude limiter including:
    (a) a comparator having first and second inputs and an output that is responsive to a difference of signals at said first and second inputs, said first input being coupled to said output of said bandpass filter; and
    (b) a threshold setting network connected to said second input of said comparator, said threshold setting network including a capacitance and including a resistance connected to a fixed source of voltage;
    wherein said bandpass filter and said amplitude limiter are connected between said optical pickup and said phase locked loop to define a timing reference signal input to said phase locked loop.

2. The signal attenuating device of claim 1 wherein said bandpass filter comprises:
    an LC network connected to determine said specific frequencies which are passed by said bandpass filter; and
    a resistor linked to said LC network to determine a shape factor of said bandpass filter.

3. The signal attenuating device of claim 1 wherein said resistance is a variable resistor.

4. The signal attenuating device of claim 1 further comprising a buffer amplifier between said optical pickup and said bandpass filter, said buffer amplifier being enabled to amplify at least signals having said specific frequencies.

5. The signal attenuating device of claim 4 further comprising a DC blocking capacitor between said buffer amplifier and said bandpass filter.

6. A method of deriving a reference frequency for processing a signal that is responsive to a laser source having a plurality of power levels comprising the steps of:
    filtering said signal through a bandpass filter to attenuate signals outside of a specified frequency band, including determining a shape factor for said specified frequency band, thereby providing a filtered output signal;
    manipulating said filtered output signal to limit amplitudes of said filtered output signal while preserving zero crossings, thereby providing an amplitude limited filtered output signal, said manipulating including generating a variable threshold input signal that is determined by varying the resistance of a resistor connected to a fixed voltage source and in parallel to a capacitor, said manipulating further including determining a difference between said filtered output signal and said variable threshold input signal; and
    passing said amplitude limited filtered output signal for use in defining an output of a phase locked loop.

7. The method of claim 6 further comprising the step of amplifying said signal prior to said step of filtering, thereby providing an amplified signal.

8. The method of claim 7 further comprising the step of blocking DC levels present in said amplified signal prior to said step of filtering.

9. The method of claim 6 wherein said step of manipulating comprises the steps of:
    establishing a maximum signal amplitude and a minimum signal amplitude;
    reducing said filtered output signal to said maximum signal amplitude when said filtered output signal exceeds said maximum signal amplitude; and
    increasing said filtered output signal to said minimum signal amplitude when said filtered output signal is below said minimum signal amplitude.

10. A signal attenuating device for an information storage system having an optical pickup and phase locked loop, said signal attenuating device comprising:
    a bandpass filter enabled to pass a predetermined range of signal frequencies and attenuate signal frequencies outside said predetermined range of signal frequencies, said bandpass filter being connected to receive signals from said optical pickup; and
    a signal amplitude limiter coupled to an output of said bandpass filter, said signal amplitude limiter enabled to alter signal amplitudes exceeding predetermined maximum and minimum values, an output of said signal amplitude limiter being connected to said phase locked loop, said signal amplitude limiter comprising:
    (a) a variable threshold network having a variable threshold setting network that includes an output and a parallel connection of a capacitor and a variable resistor, said variable resistor being connected to a fixed voltage source; and
    (b) a comparator having a first input, a second input and an output that is a difference of signals of said first input and said second input, said first input being connected to receive a first signal from said bandpass filter, said second input being connected to said output of said variable threshold setting network.

11. The signal attenuating device of claim 10 further comprising a buffer amplifier, said buffer amplifier being connected to amplify said signals prior to said signals reaching said bandpass filter.

12. The signal attenuating device of claim 11 further comprising a DC blocking capacitor, said DC blocking capacitor being enabled to block DC levels present in an output signal of said buffer amplifier prior to said output signal reaching said bandpass filter.

* * * * *